(12) United States Patent
Lin (10) Patent No.: US 11,183,546 B2
(45) Date of Patent: Nov. 23, 2021

(54) THIN FILM TRANSISTOR AND METHOD OF MANUFACTURING THE SAME, DISPLAY PANEL, AND DISPLAY DEVICE

(71) Applicant: BOE TECHNOLOGY GROUP CO., LTD., Beijing (CN)

(72) Inventor: Chuni Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 651 days.

(21) Appl. No.: 16/067,524

(22) PCT Filed: Dec. 11, 2017

(86) PCT No.: PCT/CN2017/115379
§ 371 (c)(1),
(2) Date: Jun. 29, 2018

(87) PCT Pub. No.: WO2018/205590
PCT Pub. Date: Nov. 15, 2018

(65) Prior Publication Data
US 2021/0043708 A1    Feb. 11, 2021

(30) Foreign Application Priority Data

May 9, 2017    (CN) .......................... 201710322800.9

(51) Int. Cl.
*H01L 27/32* (2006.01)
*H01L 29/66* (2006.01)
*H01L 29/51* (2006.01)

(52) U.S. Cl.
CPC ...... *H01L 27/3258* (2013.01); *H01L 27/3272* (2013.01); *H01L 29/513* (2013.01); *H01L 29/66742* (2013.01)

(58) Field of Classification Search
CPC  H01L 27/3258; H01L 27/3272; H01L 29/513
See application file for complete search history.

(56) References Cited

U.S. PATENT DOCUMENTS 9,239,484 B2    1/2016  Kuniyoshi
2002/0017685 A1    2/2002  Kasahara et al.
(Continued)

FOREIGN PATENT DOCUMENTS

CN    103165680 A    6/2013
CN    103210494 A    7/2013
(Continued)

OTHER PUBLICATIONS

International Search Report and Written Opinion issued in International Patent Application No. PCT/CN2017/115379, dated Mar. 8, 2018; with English translation.
(Continued)

*Primary Examiner* — Tucker J Wright
(74) *Attorney, Agent, or Firm* — McDermott Will and Emery LLP (57) ABSTRACT

A thin film transistor and its manufacturing method, a display panel, and a display device are provided. The thin film transistor includes an insulating layer on an active layer; the insulating layer includes m sub-insulating layers which are alternately stacked, and any two adjacent sub-insulating layers in the m sub-insulating layers have different refractive indexes, and m is an integer not less than 2.

10 Claims, 5 Drawing Sheets

(56) References Cited

U.S. PATENT DOCUMENTS

2013/0153915 A1* 6/2013 Choi ................... H01L 27/3211
                                                   257/72
2013/0329176 A1* 12/2013 Kuniyoshi ........ H01L 29/78633
                                                   349/138
2014/0021473 A1  1/2014 Yu et al.

FOREIGN PATENT DOCUMENTS

| CN | 103579357 A | 2/2014 |
| CN | 104871321 A | 8/2015 |
| CN | 104979405 A | 10/2015 |
| CN | 107134482 A | 9/2017 |
| WO | 2014/104708 A1 | 7/2014 |

OTHER PUBLICATIONS

First Office Action dated Jul. 1, 2019, issued in corresponding Chinese Patent Application No. 201710322800.9, with English translation.

* cited by examiner

Fig. 8 alternately forming m sub-insulating layers on the active layer from m kinds of light-transmitting insulating materials with different refractive indexes, so that the m sub-insulating layers are alternately stacked to constitute the insulating layer
wherein, m is an integer not less than 2

Fig. 9 at least two kinds of light-transmitting insulating materials with different refractive indexes, which are in an increase or decrease order in the refractive index, to form a first sub-insulating layer group on the active layer

↓ the remaining k-1 sub-insulating layer groups are sequentially formed on the first sub-insulating layer group, so that the k sub-insulating layer groups together constitute The m sub-insulating layers

Fig. 10

THIN FILM TRANSISTOR AND METHOD OF MANUFACTURING THE SAME, DISPLAY PANEL, AND DISPLAY DEVICE

CROSS-REFERENCE TO RELATED APPLICATION

This application is the U.S. National Phase under 35 U.S.C. § 371 of International Application No. PCT/CN2017/115379 filed on Dec. 11, 2017, which claims the benefit of Chinese Patent Application No. 201710322800.9, filed on May 9, 2017 with the Chinese Patent Office, both of which are incorporated herein by reference in its entirety.

TECHNICAL FIELD

The present disclosure relates to the field of display technologies, and in particular, to a thin film transistor and a method of manufacturing the same, a display panel, and a display device.

BACKGROUND

Thin film transistors ("TFT" for short) play an important role in the field of the display technologies as a switching device. A common thin film transistor includes at least a gate, a source, a drain, and an active layer. According to the relative positional relationship between the gate and the active layer, thin film transistors may be divided into the following categories: those with a top gate structure, and those with a bottom gate structure.

SUMMARY

According to an aspect of the present disclosure, the embodiments of the present disclosure provide a thin film transistor comprising an insulating layer on an active layer. The insulating layer comprises m sub-insulating layers which are alternately stacked, wherein any two adjacent sub-insulating layers of the m insulating layers have different refractive indexes, and m is an integer not less than two.

Optionally, the refractive index of each sub-insulating layer in the m sub-insulating layers is different.

Optionally, the m sub-insulating layers comprise k sub-insulating layer groups; in each sub-insulating layer group of the k sub-insulating layer groups, the refractive index of each sub-insulating layer increases or decreases in sequence, whereas k is an integer not less than 2.

Optionally, in any two adjacent sub-insulating layer groups in the k sub-insulating layer groups, a sub-insulating layer with the lowest refractive index in one sub-insulating layer group is disposed adjacent to a sub-insulating layer with the highest refractive index in another sub-insulating layer group.

Optionally, the insulating layer comprises at least one of a gate insulating layer and an interlayer insulating layer.

Optionally, the thin film transistor also comprises a gate, a source, a drain, and a passivation layer; the insulating layer comprises a gate insulating layer and an interlayer insulating layer; wherein the active layer is on a base substrate, the gate insulating layer is on the active layer, and the gate in on the gate insulating layer;

the interlayer insulating layer is on the base substrate, the active layer and the gate;

the drain and the source are respectively on the interlayer insulating layer, and are respectively electrically connected to the active layer;

the orthographic projection of the passivation layer on the base substrate covers the orthographic projections of the drain, the source, and the interlayer insulating layer on the base substrate.

Optionally, the thin film transistor further comprises a gate, a source, a drain, and a passivation layer; wherein the active layer is on a base substrate, and the insulating layer is on the base substrate and the active layer;

the drain and the source are respectively on the interlayer insulating layer, and are respectively electrically connected to the active layer;

the orthographic projection of the passivation layer on the base substrate covers the orthographic projections of the drain, the source, and the interlayer insulating layer on the base substrate.

the gate is on the passivation layer.

According to another aspect of the present disclosure, the embodiments of the present disclosure provide a method of manufacturing the thin film transistor. The method includes:

providing a base substrate, forming an active layer on the base substrate, and forming an insulating layer on the active layer; wherein, the method for forming an insulating layer includes: alternately forming m sub-insulating layers so that the m sub-insulating layers are alternately stacked together to constitute the insulating layer; wherein any two adjacent sub-insulating layers in the m sub-insulating layers have different refractive indexes, and m is an integer not less than 2.

Optionally, alternately forming the m sub-insulating layers includes forming the m sub-insulating layers respectively from m kinds of light-transmitting insulating materials with different refractive indexes.

Optionally, alternately forming the m sub-insulating layers includes forming k sub-insulating layer groups, so that the k sub-insulating layer groups form the m sub-insulating layers, wherein k is an integer not less than 2;

forming each sub-insulating layer group in the k sub-insulating layer groups includes forming each sub-insulating layer group by using at least two kinds of light-transmissive insulating materials with different refractive indexes which are in an increase or decrease order in the refractive index.

Optionally, in any two adjacent sub-insulating layer groups in the k sub-insulating layer groups, a sub-insulating layer with the lowest refractive index in one sub-insulating layer group is disposed adjacent to a sub-insulating layer with the highest refractive index in another sub-insulating layer group.

Optionally, the insulating layer comprises at least one of a gate insulating layer and an interlayer insulating layer.

Optionally, the insulating layer comprises a gate insulating layer and an interlayer insulating layer. Forming an insulating layer on the active layer includes: forming a gate insulating layer on the active layer, forming a gate layer on the gate insulating layer, and forming an interlayer insulating layer on the gate layer, the active layer, and the base substrate;

the method of manufacturing a thin film transistor also includes:

forming the drain layer and the source layer on the interlayer insulating layer respectively, so that the drain layer and the source layer are respectively electrically connected to the active layer;

forming a passivation layer on the drain layer, the source layer, and the interlayer insulating layer.

According to yet another aspect of the present disclosure, the embodiments of the present disclosure provide a display panel, the display panel comprises the thin film transistor provided by the above technical solution.

Optionally, the display panel is an OLED display panel, the OLED display panel comprises a light emitting structure which is in one-to-one correspondence to the thin film transistor; the orthographic projection of the light emitting structure on a base substrate is within the orthographic projection of the insulating layer on the base substrate; wherein the insulating layer is an interlayer insulating layer.

According to yet another aspect of the present disclosure, the embodiments of the present disclosure provide a display device, the display device comprises a display panel provided by the above technical solution.

BRIEF DESCRIPTION OF THE DRAWINGS

The accompanying drawings are used to provide further understanding of the disclosure and constitute a part of the description. The illustrative embodiments of the present disclosure and the description thereof are used to explain the present disclosure and do not constitute improper limitations to the present disclosure. In the accompanying drawings.

DETAILED DESCRIPTION

In order to further explain the thin film transistor, the manufacturing method thereof, the display panel, and the display device provided by the embodiments of the present disclosure, a detailed description will be provided as below with reference to the accompanying drawings of the description.

In the technology known by the inventor, when a thin film transistor with a top gate structure is used in a display panel to control the display of each corresponding sub-pixel unit in the display panel, if an active layer of the thin film transistor is irradiated with light, e.g. irradiated with light emitted from a light emitting layer and/or light emitted from the light emitting layer and reflected by other functional film layers, the conductivity of the active layer may be affected, causing a threshold voltage shift in the thin film transistor and reducing its electrical properties. As a result, it is difficult for the thin film transistor to stably control the display of each corresponding sub-pixel unit, causing the display of the display panel to be unstable.

Figure 1:
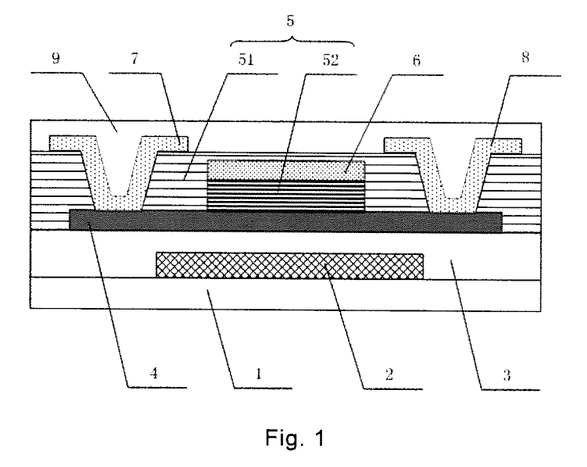
FIG. 1 is a first schematic structural diagram of a thin film transistor provided by some embodiments of the present disclosure.

To at least partially solve the above problem and improve the display quality of the display panel, as shown in FIG. 1, a thin film transistor provided by some embodiments of the present disclosure comprises an insulating layer 5 located on the active layer 4; the insulating layer 5 comprises m sub-insulating layers that are alternately stacked; wherein any two adjacent sub-insulating layers in the m sub-insulating layers have different refractive indexes, and m is an integer not less than two. For example, m may be 2, 3, 4, 5, 6, 7, 15, etc.

Figure 2:
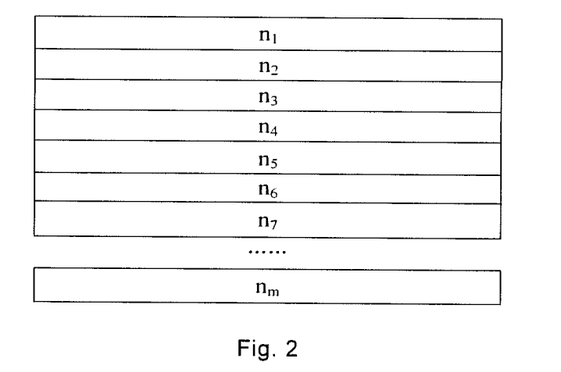
FIG. 2 is a schematic structural diagram 1 of an insulating layer provided by some embodiments of the present disclosure.

In some embodiments of the present disclosure, the refractive indexes of two adjacent sub-insulating layers in the m sub-insulating layers are different. As shown in FIG. 2, the refractive index of each sub-insulating layer in the m sub-insulating layers is different.

Figure 3:
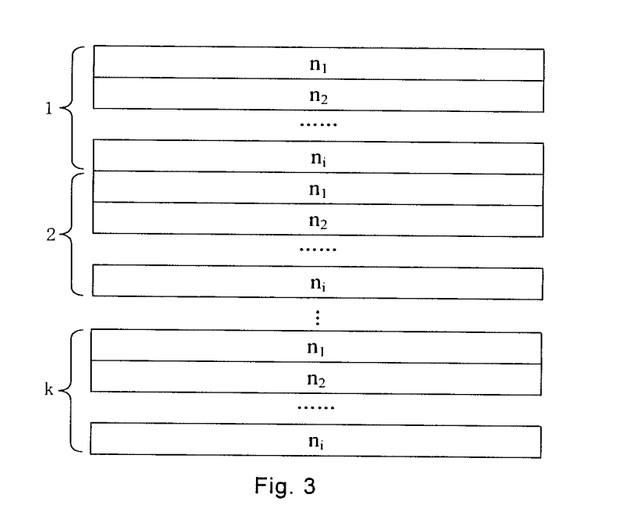
FIG. 3 is a schematic structural diagram 2 of an insulating layer provided by some embodiments of the present disclosure.

In some embodiments of the present disclosure, the m sub-insulating layers comprise k sub-insulating layer groups (k is an integer not less than two. For example, k may be 2, 3, 4, 5, 6, 7, etc.). As shown in FIG. 3, the refractive index of each sub-insulating layer in each of the sub-insulating layer groups is different.

It should be noted that those skilled in the art can set the number of sub-insulating layers in the insulating layer 5 and set the refractive index of each sub-insulating layer according to practical needs, so as to obtain an insulating layer 5 that facilitates the destructive interference after the light enters the insulating layer 5.

Generally, the orthographic projection of the thin film transistor on the base substrate 1 is outside of the orthographic projection of a light emitting structure on the base substrate 1 in the display panel, that is, the light emitted from the light emitting structure is not irradiated onto the thin film transistor vertically. In the thin film transistor provided by some embodiments of the present disclosure, if the light emitted from the light emitting layer in the display panel and/or the light emitted from the light emitting layer but reflected by other functional film layers are not perpendicularly incident on the insulating layer 5, each sub-insulating layer in the m sub-insulating layers is used to refract and reflect the light incident on the insulating layer 5 at different angles, so that the light incident on the insulating layer 5 undergoes multiple times of alternating refraction and reflection to produce multiple light beams with different light paths that collide with each other. The encounter of the peak of a certain light ray with the trough of another light ray with the same amplitude as the certain light ray will cause these two light rays to disappear and complete the destructive interference of light, i.e. the offset interference of the light, so that the insulating layer 5 effectively absorbs the light incident on the insulating layer 5.

Based on the above principle, through the insulating layer 5 with a multi-layer structure on the active layer 4, the thin film transistor provided by some embodiments of the present disclosure effectively absorbs the light that is not perpendicularly incident on the insulating layer 5, so as to prevent the light from reaching the active layer 4 and affecting its electrical conductivity, thereby avoiding the problem of the threshold voltage shift of the thin film transistor. Therefore, the thin film transistor provided by some embodiments of the present disclosure helps to improve the electrical properties of the thin film transistor and enhance the stability of its control on the display of the corresponding sub-pixel units, thereby improving the display stability and in turn the display quality of the display panel.

In some embodiments of the present disclosure, the m sub-insulating layers are composed of k sub-insulating layer groups. In each of the k sub-insulating layer groups, the refractive index of each sub-insulating layer increases or decreases sequentially. When light is incident on a sub-insulating layer group in the k sub-insulating layer groups, the sub-insulating layers with gradually varied refractive indexes will make the incident light change regularly in one sub-insulating layer group of the k sub-insulating layer groups, which helps to realize the light path control of an incident light in multiple sub-insulating layer groups in the k sub-insulating layer groups.

In some embodiments of the present disclosure, in any two adjacent sub-insulating layer groups in the k sub-insulating layer groups, the sub-insulating layer with the lowest refractive index in one sub-insulating layer group may be disposed adjacent to the sub-insulating layer with the highest refractive index in another sub-insulating layer group. When light passes from one sub-insulating layer group in the two adjacent sub-insulating layer groups into another sub-insulating layer group, this light can be refracted at the maximum angle, which is advantageous for accelerating the destructive interference of the light, thereby enabling the insulating layer 5 to effectively absorb the incident light as soon as possible.

In some embodiments of the present disclosure, the m sub-insulating layers are not divided into groups, that is, the refractive index of each sub-insulating layer in the m sub-insulating layers is different. Under this circumstance, by making sure that any two adjacent sub-insulating layers in the m sub-insulating layers differ greatly in the refractive index, the efficiency of the light incident on the insulating layer 5 being absorbed by the insulating layer 5 can also be improved.

In some embodiments of the present disclosure, the insulating layer 5 of the thin film transistor comprises a gate insulating layer 52 and an interlayer insulating layer 51. In the thin film transistor provided above, the insulating layer 5 can be any one of the gate insulating layer 52 and the interlayer insulating layer 51, or can also comprise both the gate insulating layer 52 and the interlayer insulating layer 51. For example, in the case where the insulating layer 5 comprises both the gate insulating layer 52 and the interlayer insulating layer 51, the gate insulating layer 52 comprises a plurality of alternately stacked sub-gate insulating layers, and the refractive indexes of any two adjacent sub-gate insulating layers are different; and the interlayer insulating layer 51 comprises a plurality of alternately stacked sub-interlayer insulating layers, and the refractive indexes of any two adjacent sub-interlayer insulating layers are different.

With continued reference to FIG. 1, in some embodiments of the present disclosure, the thin film transistor may be a thin film transistor having a top gate structure. The thin film transistor also comprises a gate 6, a source 8, a drain 7 and a passivation layer 9. The active layer 4 is on the base substrate 1, the gate insulating layer 52 is on the active layer 4, and the gate 6 is on the gate insulating layer 52. The interlayer insulating layer 51 is on the base substrate 1, the active layer 4 and the gate 6. The drain 7 and the source 8 are respectively on the interlayer insulating layer 51, and are respectively electrically connected to the active layer 4. The orthographic projection of the passivation layer 9 on the base substrate 1 covers the orthogonal projections of the drain 7, the source 8, and the interlayer insulating layer 51 on the base substrate 1.

In some embodiments of the present disclosure, a buffer layer 3 and a shielding layer 2 are also provided between the base substrate 1 and the active layer 4, and the shielding layer 2 is used for blocking the outside light from reaching the active layer 4. Correspondingly, the interlayer insulating layer 51 is on the buffer layer 3, the active layer 4 and the gate 6.

Figure 4:
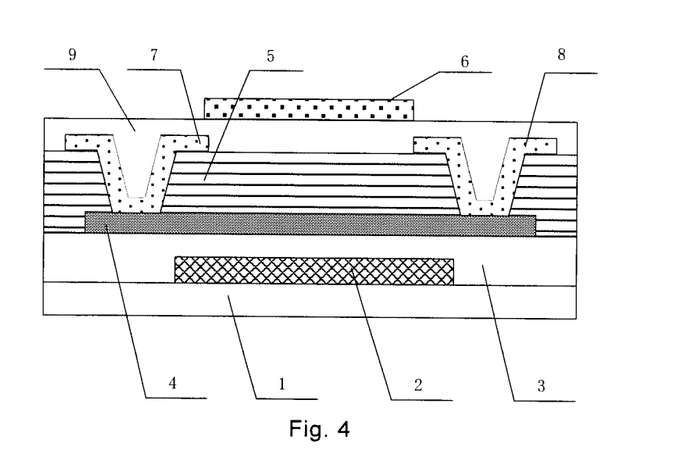
FIG. 4 is a second schematic structural diagram of a thin film transistor provided by some embodiments of the present disclosure.

In addition, as shown in FIG. 4, in some embodiments of the present disclosure, the thin film transistor may be a thin film transistor having a top gate structure. The thin film transistor also comprises a gate 6, a source 8, a drain 7, and a passivation layer 9. The active layer 4 is on the base substrate 1, and the insulating layer 5 is on the base substrate 1 and the active layer 4. The drain 7 and the source 8 are respectively on the insulating layer 5, and are respectively electrically connected to the active layer 4. The gate 6 is on the passivation layer 9. The orthographic projection of the passivation layer 9 covers the orthographic projections of the drain 7, the source 8 and the insulating layer 5 on the base substrate 1.

With continued reference to FIG. 4, in some embodiments of the present disclosure, a buffer layer 3 and a shielding layer 2 are also provided between the base substrate 1 and the active layer 4, and the shielding layer 2 is used for blocking the outside light from reaching the active layer 4. Correspondingly, the insulating layer 5 is on the buffer layer 3 and the active layer 4.

It should be noted that in some embodiments of the present disclosure, the passivation layer 9 may adopt an ordinary structure, or the structure of the insulating layer 5 in the present disclosure.

Figure 6:
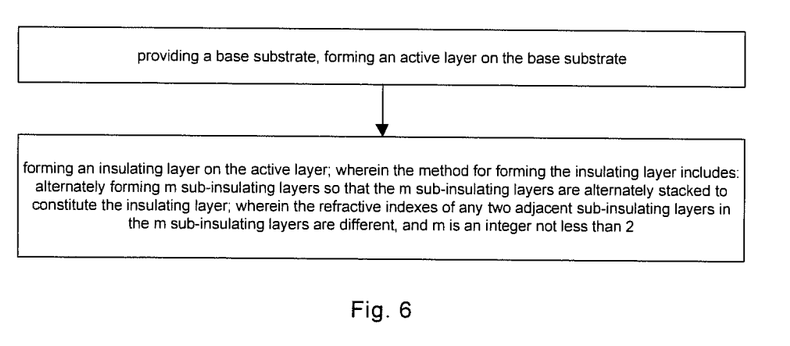
FIG. 6 is a flowchart 1 of a method for manufacturing a thin film transistor provided by some embodiments of the disclosure.

The embodiments of the present disclosure also provide a method of manufacturing a thin film transistor, which is used for manufacturing the thin film transistor provided in the above embodiments. As shown in FIG. 6, the method includes:

providing a base substrate, forming an active layer on the base substrate, and forming an insulating layer on the active layer; wherein the method for forming the insulating layer includes:

alternately forming m sub-insulating layers so that the m sub-insulating layers are alternately stacked to constitute the insulating layer; wherein the refractive indexes of any two adjacent sub-insulating layers in the m sub-insulating layers are different, and m is an integer not less than two.

Figure 9:
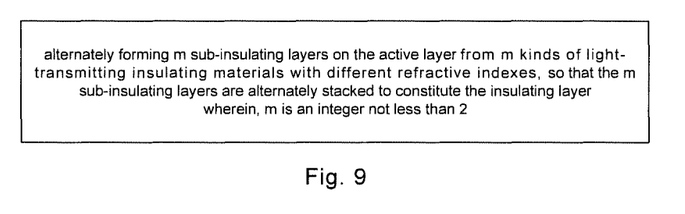
FIG. 9 is a flowchart 1 of a method for manufacturing an insulating layer provided by some embodiments of the present disclosure.

In some embodiments of the present disclosure, alternately forming m sub-insulating layers includes using m kinds of light-transmitting insulating materials with different refractive indexes to alternately forming m sub-insulating layers on the active layer, so that the refractive indexes of any two adjacent sub-insulating layers in the m sub-insulating layers are different, as shown in FIG. 9.

In some embodiments of the present disclosure, in order to facilitate the manufacture of the insulating layer and reduce the manufacturing cost of the insulating layer, the kinds of materials used for manufacturing the insulating layer may be reduced. Optionally, the sub-insulating layers can be divided in group into k sub-insulating layer groups, so that the k sub-insulating layer groups constitute alternately formed m sub-insulating layers. In this structure, it is only necessary to make sure that the materials of the sub-insulating layers within each of the k sub-insulating layer groups have different refractive indexes.

In some embodiments of the present disclosure, a material for making each sub-insulating layer within each sub-insulating layer group in the k sub-insulating layer groups may be silicon dioxide, niobium pentoxide, silicon nitride, benzocyclobutene (BCB), cycloolefin copolymer (COC), fluorocarbon polymer, calcium fluoride ($CaF_2$), or magnesium fluoride ($MgF_2$).

Figure 10:
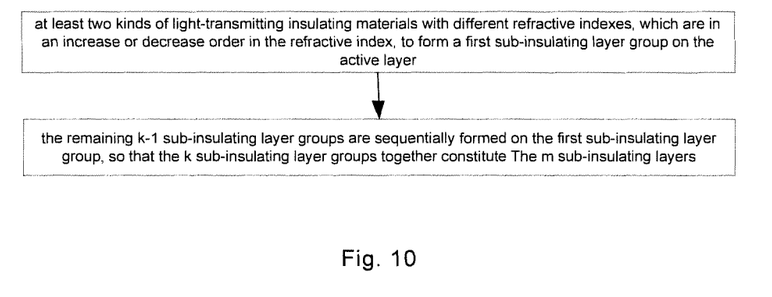
FIG. 10 is a flowchart 2 of a method for manufacturing an insulating layer provided by some embodiments of the present disclosure.

For example, referring to FIG. 10, at least two kinds of light-transmitting insulating materials with different refractive indexes, which are in an increase or decrease order in the refractive index, are used to form a first sub-insulating layer group on the active layer. And then the remaining k−1 sub-insulating layer groups are sequentially formed on the first sub-insulating layer group, so that the k sub-insulating layer groups together constitute m sub-insulating layers. That is, the light-transmitting insulating materials used in the first sub-insulating layer group can also be used in other sub-insulating layer groups. It should be added that the number of sub-insulating layers in each sub-insulating layer group in the k sub-insulating layer groups may be the same or different, and it is not particularly limited in the embodiments of the present disclosure.

In order to improve the absorption efficiency of the light incident on the insulating layer 5 which is absorbed by the insulating layer 5, in the method of manufacturing a thin film transistor provided by some embodiments of the present disclosure, the sub-insulating layers are formed in groups, and within any two adjacent sub-insulating groups in the k sub-insulating layer groups, a sub-insulating layer with the lowest refractive index in one sub-insulating layer group is formed adjacent to a sub-insulating layer with the highest refractive index in another sub-insulating layer group. In this way, when light passes from one sub-insulating layer group in the two adjacent sub-insulating layer groups into another sub-insulating layer group, this light can be refracted at the maximum angle, so that it is advantageous for accelerating the destructive interference of the light. Thereby, the insulating layer is enabled to effectively absorb the incident light as soon as possible.

In a method of manufacturing a thin film transistor provided by some embodiments of the present disclosure, m kinds of light-transmitting insulating materials with different refractive indexes are used to form the insulating layer, and the absorption efficiency of light incident on the insulating layer which is absorbed by the insulating layer can also be improved by adopting two light-transmitting insulating materials which differ greatly in refractive index to form two sub-insulating layers adjacent to each other.

It should be noted that the insulating layer of the thin film transistor comprises a gate insulating layer and an interlayer insulating layer. In the above method of manufacturing a thin film transistor, the insulating layer may be one of the gate insulating layer or the interlayer insulating layer, and may comprise both the gate insulating layer and the interlayer insulating layer. For example, when the insulating layer comprises both the gate insulating layer and the interlayer insulating layer, the gate insulating layer is formed by alternately stacking a plurality of sub-gate insulating layers, and any two adjacent sub-gate insulating layers have different refractive indexes; and the interlayer insulating layer is formed by alternately stacking a plurality of sub-interlayer insulating layers, and any two adjacent sub-interlayer insulating layers have different refractive indexes.

Figure 7:
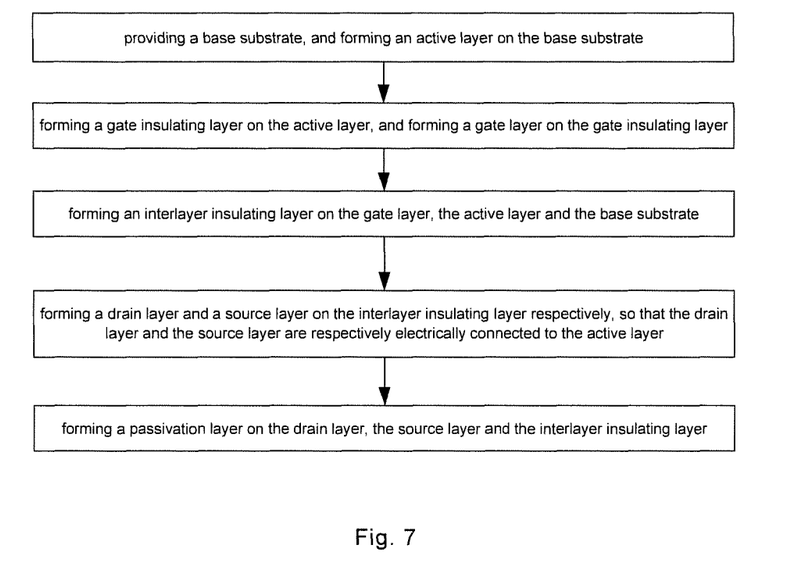
FIG. 7 is flowchart 2 of a method for manufacturing a thin film transistor provided by some embodiments of the present disclosure.

In some embodiments of the present disclosure, the thin film transistor may be a thin film transistor having a top gate structure. In the case where the insulating layer of the thin film transistor comprises both a gate insulating layer and an interlayer insulating layer, as shown in FIG. 7, the method of manufacturing the thin film transistor includes:

S1. providing a base substrate, and forming an active layer on the base substrate.

S2. forming a gate insulating layer on the active layer, and forming a gate layer on the gate insulating layer.

S3. forming an interlayer insulating layer on the gate layer, the active layer and the base substrate.

S4. forming a drain layer and a source layer on the interlayer insulating layer respectively, so that the drain layer and the source layer are respectively electrically connected to the active layer.

S5. forming a passivation layer on the drain layer, the source layer and the interlayer insulating layer.

Figure 8:
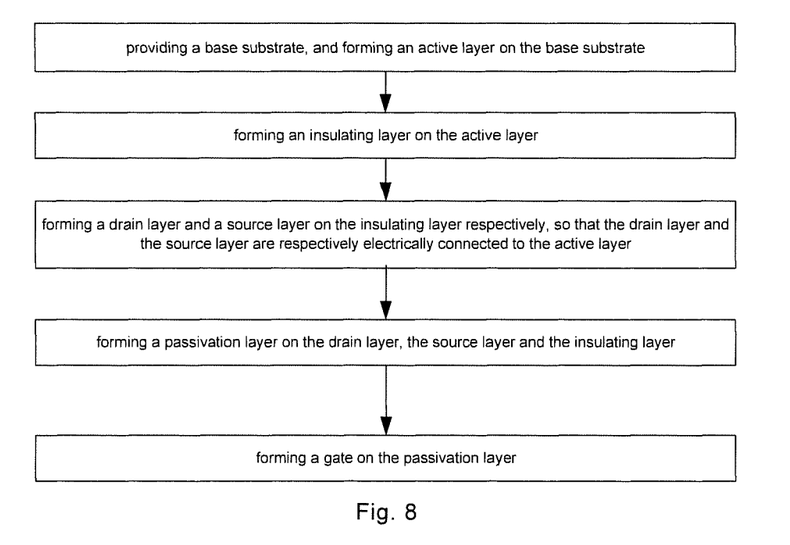
FIG. 8 is a flowchart 3 of a method for manufacturing a thin film transistor provided by some embodiments of the present disclosure.

In some embodiments of the present disclosure, the thin film transistor may be a thin film transistor having a top gate structure. In the case where the insulating layer of the thin film transistor comprises both a gate insulating layer and an interlayer insulating layer, as shown in FIG. 8, the method of manufacturing the thin film transistor specifically includes:

S1. providing a base substrate, and forming an active layer on the base substrate.

S2. forming an insulating layer on the active layer.

S3. forming a drain layer and a source layer on the insulating layer respectively, so that the drain layer and the source layer are respectively electrically connected to the active layer.

S4. forming a passivation layer on the drain layer, the source layer and the insulating layer.

S5. forming a gate on the passivation layer.

The embodiments of the present disclosure also provide a display panel, and the display panel comprises the thin film transistor provided by the above embodiments.

In the thin film transistor in the display panel provided by these embodiments, the insulating layer formed on the active layer are composed of m alternately stacked sub-insulating layers, and any two adjacent sub-insulating layers have different refractive indexes. When there is an incident light which is not perpendicular to the insulating layer, each sub-insulating layer is used to refract and reflect the incident light in a corresponding angle, so that the light incident on the insulating layer undergoes multiple times of alternating refraction and reflection to produce multiple light beams with different light paths that collide with each other. At this time, if the peak of one light ray meets with the trough of another light ray which has the same amplitude as the one light ray, these two light rays will disappear and complete the destructive interference of light, i.e. the offset interference of light. In this way, the light incident on the insulating layer can be effectively absorbed by the insulating layer, thus preventing the light from reaching the active layer and affecting its electrical conductivity, thereby avoiding the problem of the threshold voltage shift of the thin film transistor. Therefore, the thin film transistor provided by the embodiments of the present disclosure helps to improve the electrical properties of the thin film transistor and enhances the stability of the control on the display of the corresponding sub-pixel unit by the thin film transistor, thereby the display stability of the display panel is enhanced and the display quality of the display panel is improved.

Figure 5:
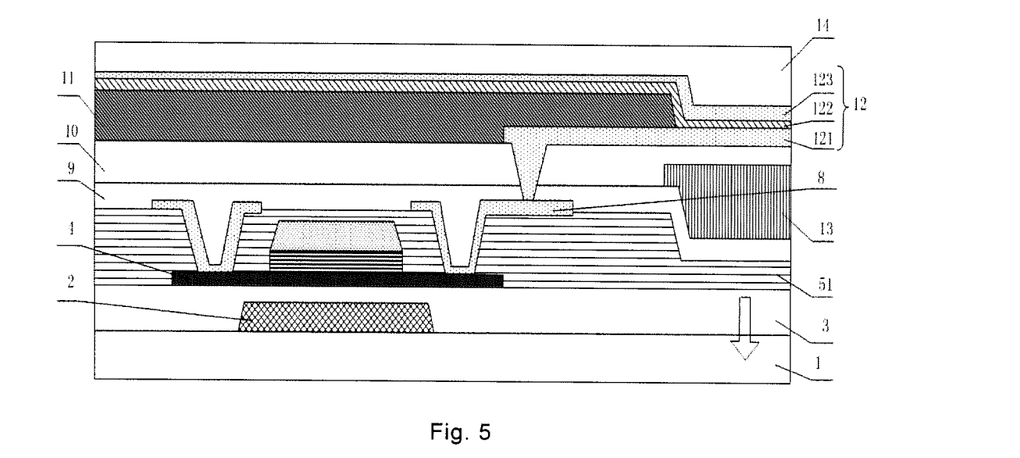
FIG. 5 is a schematic structural diagram of a display panel provided by some embodiments of the present disclosure.

In some embodiments of the present disclosure, the display panel is an OLED display panel. As shown in FIG. 5, the OLED display panel comprises a light emitting structure 12 in one-to-one correspondence to the thin film transistor. The orthographic projection of the light emitting structure 12 on the base substrate 1 is within the orthographic projection of the insulating layer on the base substrate 1, wherein the insulating layer is an interlayer insulating layer 51. In other words, the interlayer insulating layer 51 disposed between the light emitting structure 12 and the base substrate 1 can cover the irradiated region of the light emitting structure 12, and the reflection region of the light emitted by the light emitting structure 12 but reflected by the base substrate 1 and other functional film layers such as the buffer layer 3 and the passivation layer 9. In this way, by using a structure in which the interlayer insulating layer 51 is formed by alternately stacking a plurality of sub-interlayer insulating layers with different refractive indexes, it is possible to absorb light that is not perpendicularly incident on the interlayer insulating layer 51. As a result, in a sub-pixel unit where the light emitting structure 12 is disposed, the light leakage from the light emitting structure 12 to the adjacent sub-pixel units can be prevented, thereby it is possible to avoid affecting the display of the display panel and the display quality of the display panel is improved.

In the display panel, a plurality of sub-pixel units in array are generally defined by a pixel definition layer 11, and a thin film transistor and a light emitting structure 12 which is one-to one corresponding to the thin film transistor are correspondingly provided in each sub-pixel unit. It should be noted that in the OLED display panel, the light emitting structure 12 refers to an OLED light emitting device. The OLED light emitting device, for example, comprises an anode layer 121, a cathode layer 123, and a light emitting functional layer 122 provided between the anode layer 121 and the cathode layer 123. The light emitting functional layer 122 may have a single layer structure, that is, the light emitting functional layer 122 only comprises a light emitting layer disposed between the anode layer 121 and the cathode layer 123. Or, the light emitting functional layer 122 may have a multilayer structure. For example, the light emitting functional layer 122 comprises a hole transport layer, a light emitting layer, and an electron transport layer that are stacked between the anode layer 121 and the cathode layer 123.

In the display panel provided by some embodiments of the present disclosure, with continued reference to FIG. 5, a planarization layer 10 and a pixel definition layer 11 are disposed between the thin film transistor and the light emitting structure 12. A via hole is disposed on the passivation layer 9 of the thin film transistor and the planarization layer 10 in the position corresponding to the source 8, so that the anode layer 121 of the light emitting structure 12 is electrically connected to the source 8 through the via hole.

In the display panel provided in some embodiments of the present disclosure, the light emitting structure 12 refers to a white OLED light emitting device. Between the planarization layer 10 and the passivation layer 9 there is provided a color resistance layer 13, which is on a light emitting side of the light emitting structure 12 and directly faces the light emitting area of the light emitting structure 12, to realize the color display of the display panel.

In the display panel provided by some embodiments of the present disclosure, since the material constituting the OLED light emitting device is extremely sensitive to water and oxygen, a high-quality encapsulating film layer 14 can be disposed on the OLED light emitting device, so as to protect the OLED light-emitting device in the OLED display panel from water and oxygen, thereby ensuring the stable use of the OLED light-emitting device and letting the OLED light-emitting device have a certain service life.

Although an OLED panel is used as an example for illustrative description as above, those skilled in the art can easily understand that a backlight panel such as a TFT-LCD, or other types of self-luminous EL panels such as a QLED or a Micro LED, can also be applied to this technical solution. In the meantime, the present application does not limit the light emitting panel as a top-emitting panel or a bottom-emitting panel.

The embodiments of the present disclosure also provide a display device, and the display device comprises the display panel provided by the above embodiments. As the display panel in the display device has the same advantages as the display panel in the above embodiments, it will not be elaborated here.

The above display device can be products or components with display function such as a mobile phone, a tablet, a laptop, a monitor, a television, a digital photo frame, or a navigator.

The foregoing descriptions are merely specific implementation manners of the present disclosure, but the protection scope of the present disclosure is not limited thereto, and the changes or replacements that any person skilled in the art can easily think of within the scope of the present disclosure should be within the scope of protection of the present disclosure. Therefore, the protection scope of the present disclosure shall be subject to the protection scope of the claims.

What is claimed is:

1. A thin film transistor, comprising an insulating layer on an active layer; wherein the insulating layer comprises m sub-insulating layers which are alternately stacked; wherein, any two adjacent sub-insulating layers in the m sub-insulating layers have different refractive indexes, and m is an integer not less than two; wherein the m sub-insulating layers comprise k sub-insulating layer groups; in each sub-insulating layer group of the k sub-insulating layer groups, the number of sub-insulating layers is not less than three, and the refractive index of each sub-insulating layer increases or decreases sequentially, wherein k is an integer not less than two; wherein in any two adjacent sub-insulating layer groups in the k sub-insulating layer groups, a sub-insulating layer with the lowest refractive index in one sub-insulating layer group is disposed adjacent to a sub-insulating layer with the highest refractive index in another sub-insulating layer group.

2. The thin film transistor according to claim 1, wherein each of the m sub-insulating layers has a different refractive index.

3. The thin film transistor according to claim 1, wherein the insulating layer comprises at least one of a gate insulating layer and an interlayer insulating layer.

4. The thin film transistor according to claim 1, wherein the thin film transistor also comprises a gate, a source, a drain and a passivation layer; the insulating layer comprises a gate insulating layer and an interlayer insulating layer; wherein the active layer is on a base substrate, the gate insulating layer is on the active layer, and the gate is on the gate insulating layer;

the interlayer insulating layer is on the base substrate, the active layer and the gate;

the drain and the source are respectively on the interlayer insulating layer, and are respectively electrically connected to the active layer;

the orthographic projection of the passivation layer on the base substrate covers the orthographic projections of the drain, the source and the interlayer insulating layer on the base substrate.

5. The thin film transistor according to claim 1, wherein the thin film transistor also comprises a gate, a source, a drain and a passivation layer; wherein the active layer is on a base substrate, and the insulating layer is on the base substrate and the active layer;

the drain and the source are respectively on the insulating layer, and are respectively electrically connected to the active layer;

the orthographic projection of the passivation layer on the base substrate covers the orthographic projections of the drain, the source and the insulating layer on the base substrate;

the gate is on the passivation layer.

6. A display panel, comprising a thin film transistor, wherein the thin film transistor comprises an insulating layer on an active layer, and the insulating layer comprises m sub-insulating layers which are alternately stacked; any two adjacent sub-insulating layers in the m sub-insulating layers have different refractive indexes, and m is an integer not less than two; wherein the m sub-insulating layers comprise k sub-insulating layer groups; in each sub-insulating layer group of the k sub-insulating layer groups, the number of sub-insulating layers is not less than three, and the refractive index of each sub-insulating layer increases or decreases sequentially, wherein k is an integer not less than two; wherein in any two adjacent sub-insulating layer groups in the k sub-insulating layer groups, a sub-insulating layer with the lowest refractive index in one sub-insulating layer group is disposed adjacent to a sub-insulating layer with the highest refractive index in another sub-insulating layer group.

7. The display panel according to claim 6, wherein the display panel is an OLED display panel; and the OLED display panel comprises a light emitting structure which is in one-to-one correspondence to the thin film transistor; the orthographic projection of the light emitting structure on a base substrate is within the orthographic projection of the insulating layer on the base substrate; wherein the insulating layer is an interlayer insulating layer.

8. A display device, comprising a display panel according to claim 6.

9. The display panel according to claim 6, wherein each of the m sub-insulating layers has a different refractive index.

10. The display panel according to claim 6, wherein the insulating layer comprises at least one of a gate insulating layer and an interlayer insulating layer.

* * * * *